(12) United States Patent
Obata et al.

(10) Patent No.: US 9,202,982 B2
(45) Date of Patent: Dec. 1, 2015

(54) SEMICONDUCTOR LIGHT EMITTING DEVICE AND METHOD FOR MANUFACTURING THE SAME

(71) Applicant: KABUSHIKI KAISHA TOSHIBA, Tokyo (JP)

(72) Inventors: Susumu Obata, Kanagawa-ken (JP); Toshiya Nakayama, Kanagawa-ken (JP); Hisashi Ito, Kanagawa-ken (JP); Akiya Kimura, Kanagawa-ken (JP); Kazuo Shimokawa, Kanagawa-ken (JP); Kazuhito Higuchi, Kanagawa-ken (JP); Akihiro Kojima, Kanagawa-ken (JP); Miyoko Shimada, Kanagawa-ken (JP); Yoshiaki Sugizaki, Kanagawa-ken (JP); Hideto Furuyama, Kanagawa-ken (JP)

(73) Assignee: Kabushiki Kaisha Toshiba, tokyo (JP)

( * ) Notice: Subject to any disclaimer, the term of this patent is extended or adjusted under 35 U.S.C. 154(b) by 189 days.

(21) Appl. No.: 13/826,935

(22) Filed: Mar. 14, 2013

(65) Prior Publication Data

US 2013/0248917 A1 Sep. 26, 2013

(30) Foreign Application Priority Data

Mar. 23, 2012 (JP) ................................. 2012-068315

(51) Int. Cl.
*H01L 33/38* (2010.01)
*H01L 27/15* (2006.01)
*H01L 33/00* (2010.01)

(52) U.S. Cl.
CPC ................ *H01L 33/38* (2013.01); *H01L 27/15* (2013.01); *H01L 33/0079* (2013.01)

(58) Field of Classification Search
CPC ................... H01L 2924/00; H01L 2924/0002; H01L 2924/12032; H01L 25/167; H01L 2224/24; H01L 23/60; H01L 27/156; H01L 2924/19105; H01L 33/04; H01L 33/14; H01L 33/32; H01L 33/62; H01L 41/18; H01L 41/187
See application file for complete search history.

(56) References Cited

U.S. PATENT DOCUMENTS 7,883,910 B2 * 2/2011 Tsai ...................... H01L 25/167
257/98
8,487,321 B2 * 7/2013 Yen ..................... H05B 33/0803
257/88

(Continued)

FOREIGN PATENT DOCUMENTS

JP 10-200159 A 7/1998
JP 2006-66863 A 3/2006

(Continued)

OTHER PUBLICATIONS

U.S. Appl. No. 13/826,509, filed Mar. 14, 2013, Kimura, et al.
U.S. Appl. No. 13/833,170, filed Mar. 15, 2013, Higuchi, et al.
U.S. Appl. No. 13/607,480, filed Sep. 7, 2012, Toshiya Nakayama, et al.

(Continued)

*Primary Examiner* — Stephen W Smoot
*Assistant Examiner* — Edward Chin
(74) *Attorney, Agent, or Firm* — Oblon, McClelland, Maier & Neustadt, L.L.P.

(57) ABSTRACT

A semiconductor light emitting device includes a light emitting unit, a first and second electrode, a first and second metal pillar, a sealing unit, a rectifying element, and a first and second interconnection. The light emitting unit includes a first and second semiconductor layer, and a light-emitting layer. The light-emitting layer is provided on the first semiconductor layer. The second semiconductor layer is provided on the light-emitting layer. The first electrode is provided on the first semiconductor layer. The second electrode is provided on the second semiconductor layer. The first metal pillar is electrically connected to the first electrode. The second metal pillar is electrically connected to the second electrode. The sealing unit seals the first metal pillar and the second metal pillar. The rectifying element is provided below the first semiconductor layer, including a rectifying unit.

17 Claims, 12 Drawing Sheets

(56) References Cited

U.S. PATENT DOCUMENTS

| | | | | |
|---|---|---|---|---|
| 2007/0045655 | A1* | 3/2007 | Song | H01L 33/04 257/104 |
| 2008/0122376 | A1* | 5/2008 | Lys | H05B 33/0857 315/192 |
| 2010/0176418 | A1* | 7/2010 | Muraki | H01L 33/20 257/103 |
| 2010/0308347 | A1* | 12/2010 | Yeh | H01L 27/156 257/88 |
| 2012/0154503 | A1* | 6/2012 | Daniel | H02N 2/18 347/110 |
| 2012/0241792 | A1 | 9/2012 | Obata et al. | |
| 2013/0015483 | A1 | 1/2013 | Shimokawa et al. | |

FOREIGN PATENT DOCUMENTS

| | | |
|---|---|---|
| JP | 2006-228904 | 8/2006 |
| JP | 2009-152637 | 7/2009 |
| JP | 2010-141176 A | 6/2010 |
| JP | 2010-171167 | 8/2010 |
| JP | 2011-249426 A | 12/2011 |

OTHER PUBLICATIONS

U.S. Appl. No. 13/607,418, filed Sep. 7, 2012, Akiya Kimura, et al.
Office Action issued on Jan. 31, 2014 in the counterpart Japanese Patent Application No. 2012-068315 (with English Translation).
U.S. Appl. No. 14/026,178, filed Sep. 13, 2013, Kimura et al.

* cited by examiner

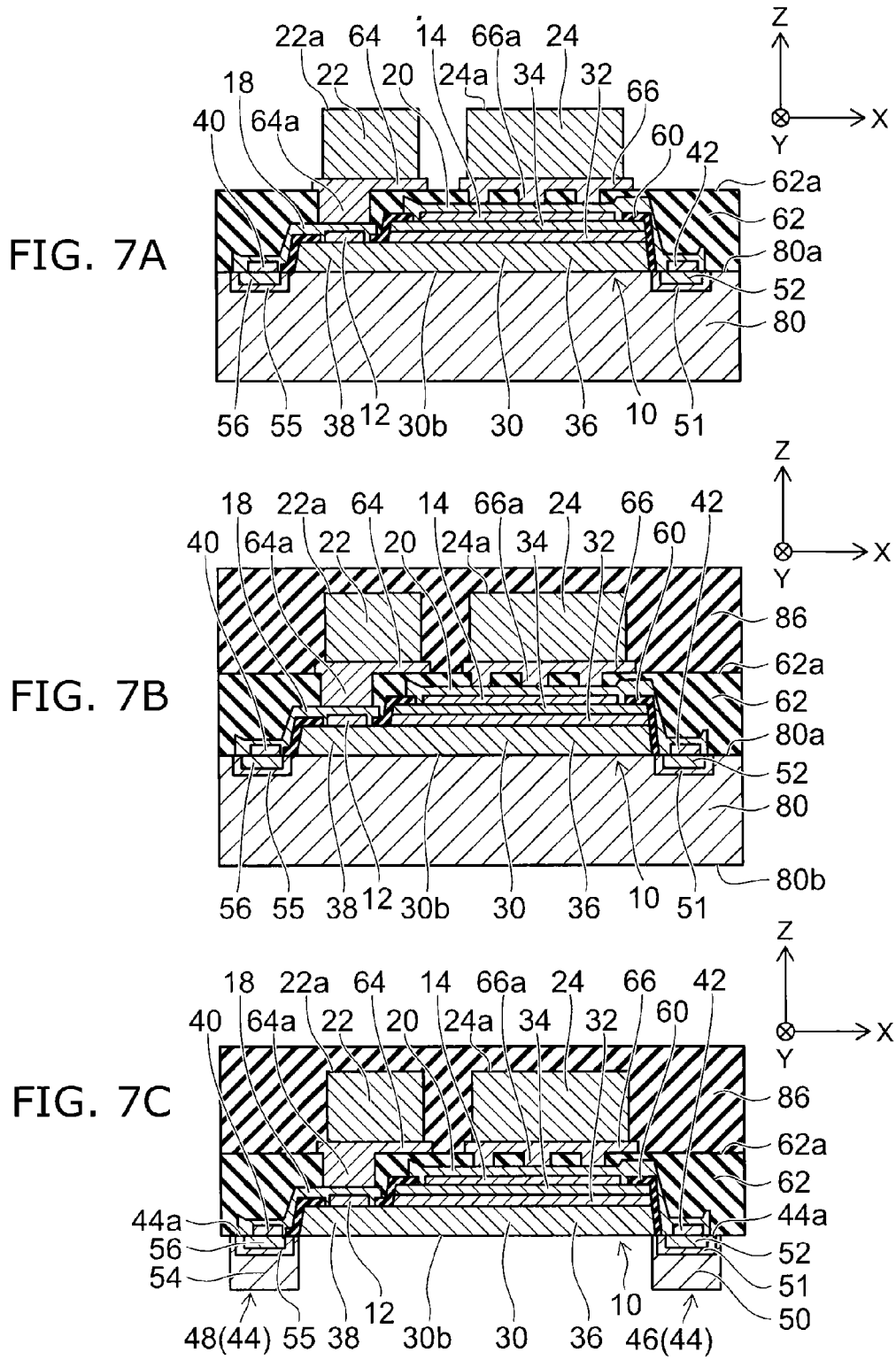

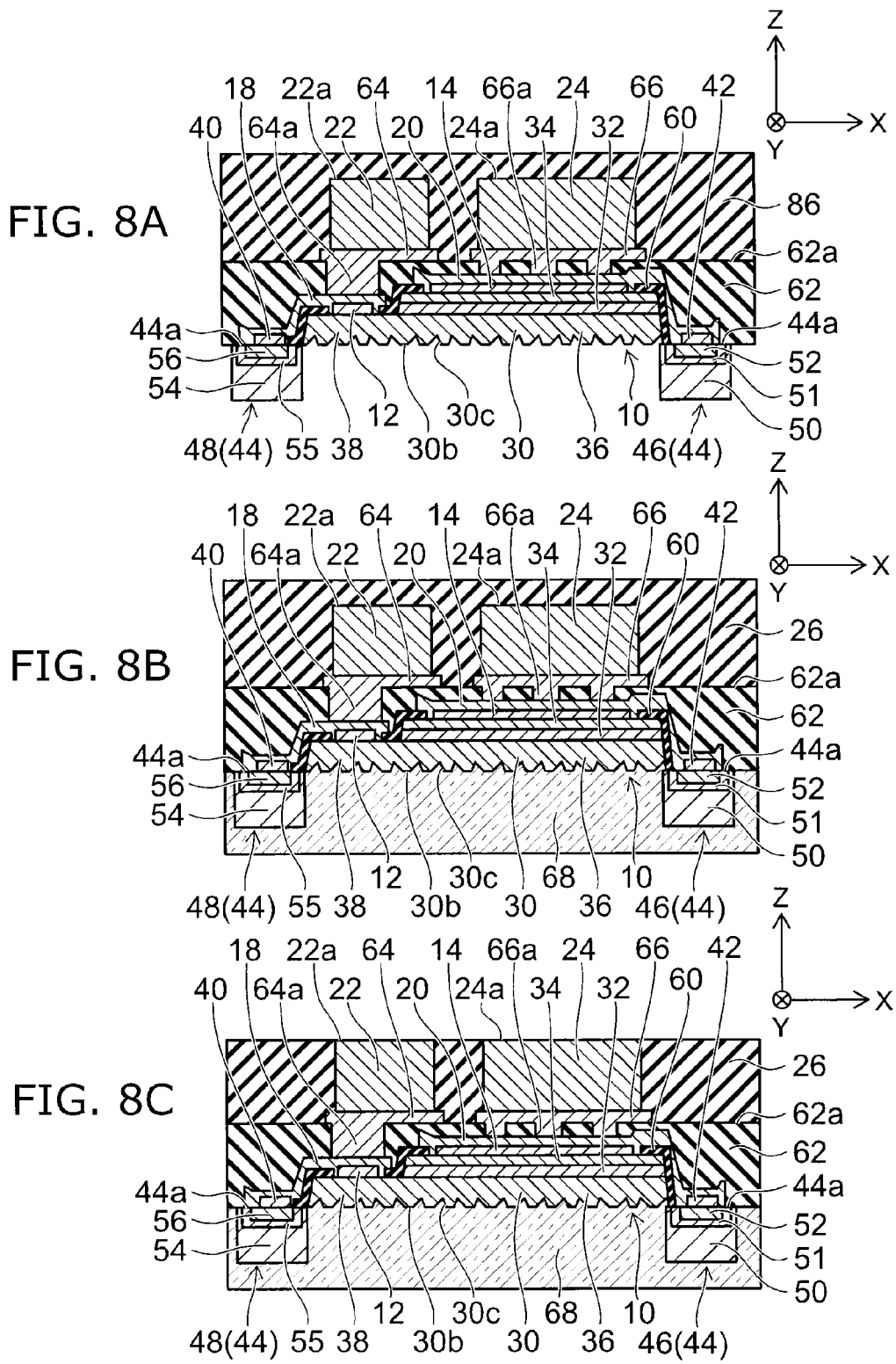

SEMICONDUCTOR LIGHT EMITTING DEVICE AND METHOD FOR MANUFACTURING THE SAME

CROSS-REFERENCE TO RELATED APPLICATIONS

This application is based upon and claims the benefit of priority from the prior Japanese Patent Application No. 2012-068315, filed on Mar. 23, 2012; the entire contents of which are incorporated herein by reference.

FIELD

Embodiments described herein relate generally to a semiconductor light emitting device and a method for manufacturing the same.

BACKGROUND

A semiconductor light emitting device such as a light-emitting diode has been widely used. There is a configuration to protect the semiconductor light emitting device from a reverse overvoltage caused by electrostatic discharge (ESD), by connecting the semiconductor light emitting device to a rectifying element such as a diode in parallel.

However, when the rectifying element is provided, a whole size of a device is increased. When the rectifying element is provided without changing the size of the device, a light-emitting area is reduced and a light amount is decreased.

BRIEF DESCRIPTION OF THE DRAWINGS

FIG. 7A to FIG. 7C are schematic cross-sectional views illustrating the method for manufacturing the semiconductor light emitting device according to the first embodiment;

FIG. 8A to FIG. 8C are schematic cross-sectional views illustrating the method for manufacturing the semiconductor light emitting device according to the first embodiment;

DETAILED DESCRIPTION

Figure 1A:
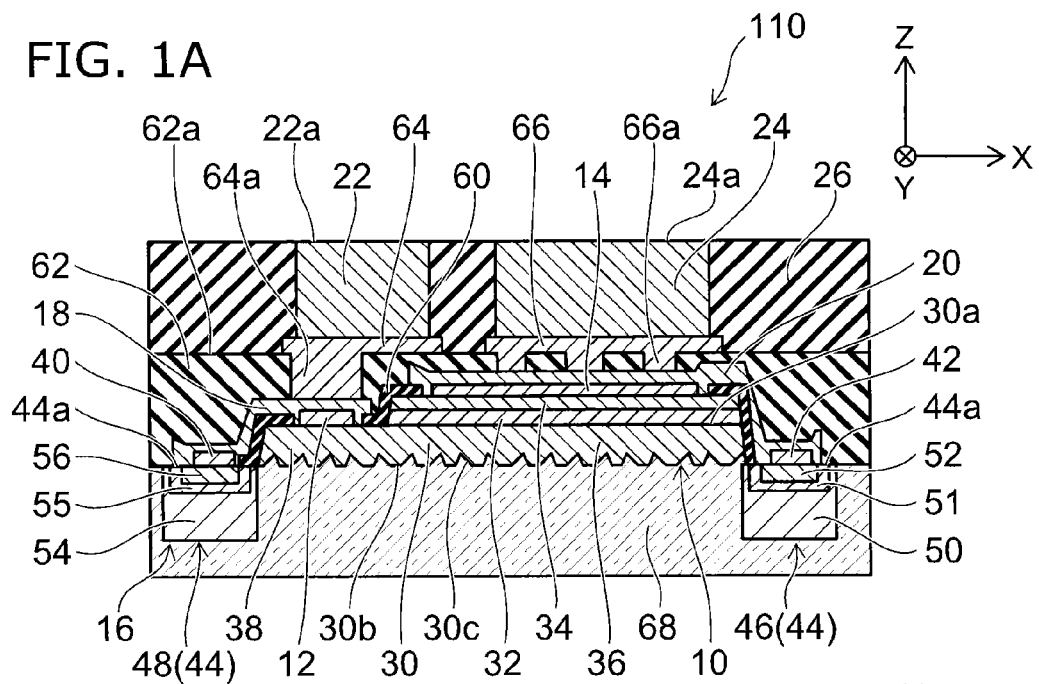
FIG. 1A and FIG. 1B are schematic views illustrating a semiconductor light emitting device according to a first embodiment.

According to one embodiment, a semiconductor light emitting device includes a light emitting unit, a first electrode, a second electrode, a first metal pillar, a second metal pillar, a sealing unit, a rectifying element, a first interconnection, and a second interconnection. The light emitting unit includes a first semiconductor layer, a light-emitting layer, and a second semiconductor layer. The first semiconductor layer has a first conductivity type and has a first portion and a second portion. The light-emitting layer is provided on the first portion. The second semiconductor layer has a second conductivity type and is provided on the light-emitting layer. The first electrode is provided on the second portion and is electrically connected to the first semiconductor layer. The second electrode is provided on the second semiconductor layer and is electrically connected to the second semiconductor layer. The first metal pillar is electrically connected to the first electrode, extends in a first direction from the first semiconductor layer to the second semiconductor layer, and has an end not parallel to the first direction. The second metal pillar is electrically connected to the second electrode, extends in the first direction, and has an end not parallel to the first direction. The sealing unit seals the first metal pillar and the second metal pillar. The sealing unit exposes the end of the first metal pillar and the end of the second metal pillar. The rectifying element is provided below the first semiconductor layer, including a rectifying unit having at least one part not overlapping with the light emitting unit when projected onto a plane intersecting with the first direction. The first interconnection electrically connects the first electrode to one end of the rectifying unit. The second interconnection electrically connects the second electrode to another end of the rectifying unit.

According to another embodiment, a method is disclosed for manufacturing a semiconductor light emitting device. The method can include removing one part of a stacked mother body provided on an upper face of a semiconductor substrate to form a light emitting unit on the semiconductor substrate, and exposing one part of the upper face of the semiconductor substrate. The stacked mother body includes a first semiconductor film having a first conductivity type, a light-emitting film provided on the first semiconductor film, and a second semiconductor film having a second conductivity type and provided on the light-emitting film. The light emitting unit includes a first semiconductor layer formed of the first semiconductor film and including a first portion and a second portion, a light-emitting layer formed of the light-emitting film and provided on the first portion, and a second semiconductor layer formed of the second semiconductor film and provided on the light-emitting layer. The method can include forming a rectifying element including a rectifying unit in the exposed part of the upper face. The rectifying unit is provided below the first semiconductor layer and has at least one part not overlapping with the light emitting unit when projected onto a plane intersecting with a first direction from the first semiconductor layer to the second semiconductor layer. The method can include forming a first electrode provided on the second portion and electrically connected to the first semiconductor layer, and forming a second electrode provided on the second semiconductor layer and electrically connected to the second semiconductor layer. The method can include electrically connecting the first electrode to one end of the rectifying unit by a first interconnection, and electrically connecting the second electrode to another end of the rectifying unit by a second interconnection. The method can include forming a first metal pillar electrically connected to the first electrode, extending in the first direction, and having an end not parallel to the first direction, and forming a second metal pillar electrically connected to the second electrode, extending in the first direction, and having an end not parallel to the first direction. The method can include forming a sealing unit for sealing the first metal pillar and the second metal pillar. The sealing unit exposes the end of the first metal pillar and the end of the second metal pillar.

Various embodiments will be described hereinafter with reference to the accompanying drawings.

In addition, the drawing is schematic and conceptual, so that a relationship between a thickness and a width of each part, and a ratio in size among the parts do not always coincide with real ones. In addition, even when the same part is shown, its dimension and ratio are occasionally shown differently according to the drawing.

Furthermore, in the specification and each drawing, the same element as that described in the previous drawing is affixed with the same reference numeral and its detailed description is omitted as appropriate.

(First Embodiment)

Figure 1B:
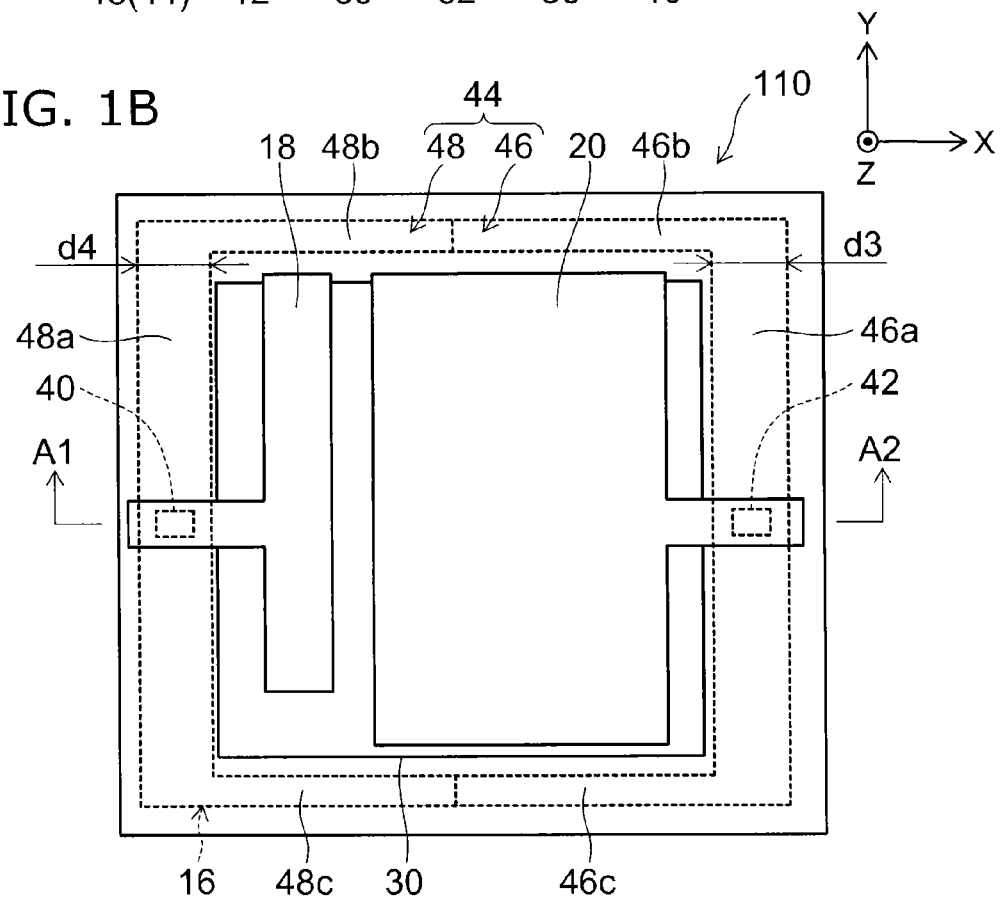

FIG. 1A and FIG. 1B are schematic views illustrating a semiconductor light emitting device according to a first embodiment.

FIG. 1A is a schematic cross-sectional view, and FIG. 1B is a schematic top view. FIG. 1A schematically shows a cross section taken along a line A1-A2 in FIG. 1B.

As shown in FIG. 1A and FIG. 1B, a semiconductor light emitting device 110 according to the embodiment is provided with a light emitting unit 10, a first electrode 12, a second electrode 14, a rectifying element 16, a first interconnection 18, a second interconnection 20, a first metal pillar 22, a second metal pillar 24, and a sealing unit 26. In FIG. 1B, some components such as the first metal pillar 22, the second metal pillar 24, and the sealing unit 26 are omitted to simplify the drawing.

The light emitting unit 10 includes a first semiconductor layer 30, a light-emitting layer 32, and a second semiconductor layer 34.

The first semiconductor layer 30 has a first portion 36, and a second portion 38. The second portion 38 is juxtaposed to the first portion 36. The first semiconductor layer 30 has a first conductivity type.

The light-emitting layer 32 is provided on the first portion 36. The first portion 36 is a part opposed to the light-emitting layer 32, in the first semiconductor layer 30. The second portion 38 is a part not opposed to the light-emitting layer 32, in the first semiconductor layer 30.

The second semiconductor layer 34 is provided on the light-emitting layer 32. The second semiconductor layer 34 has a second conductivity type. The second conductivity type is a conductivity type different from the first conductivity type. For example, the first conductivity type is an n type, and the second conductivity type is a p type. The embodiment is not limited to this, and the first conductivity type may be the p type, and the second conductivity type may be the n type.

Hereinafter, a description will be given of the case where the first conductivity type is the n type, and the second conductivity type is the p type.

Each of the first semiconductor layer 30, the light-emitting layer 32, and the second semiconductor layer 34 includes a nitride semiconductor. The first semiconductor layer 30 includes a buffer layer for forming an n-type cladding layer, and the n-type cladding layer. The second semiconductor layer 34 includes a p-type cladding layer. The light-emitting layer 32 has a single quantum well (SQW) configuration, or a multi quantum well (MQW) configuration.

The light-emitting layer 32 having the SQW configuration includes two barrier layers, and a well layer provided between the barrier layers. The light-emitting layer 32 having the MQW configuration includes three or more barrier layers, and well layers provided between the barrier layers. As the barrier layer, a GaN compound semiconductor is used. As the well layer, an InGaN compound semiconductor is used. In a case where the barrier layer includes In, a composition ratio of In in the barrier layer is set lower than a composition ratio of In in the well layer.

Crystals of the first semiconductor layer 30, the light-emitting layer 32, and the second semiconductor layer 34 are grown in this order on a substrate, whereby a stacked crystal film serving as the light emitting unit 10 is formed. One part of the stacked crystal film is removed from a side of the second semiconductor layer 34 to the first semiconductor layer 30. Thus, one part of the first semiconductor layer 30 (second portion 38) is exposed, and the light-emitting layer 32 and the second semiconductor layer 34 are left on the first portion 36. In this way, the light emitting unit 10 is formed. The second portion 38 is juxtaposed to the first portion 36 in an X-Y plane. The light emitting unit 10 is separated from the substrate after crystals have been grown on the substrate.

Here, a first direction from the first semiconductor layer 30 to the second semiconductor layer 34 is assumed as a Z-axis direction. A direction perpendicular to the Z-axis direction is assumed as an X-axis direction. A direction perpendicular to the Z-axis direction and the X-axis direction is assumed as a Y-axis direction. The first semiconductor layer 30 has an upper face 30a which is not parallel to the Z-axis direction, and a lower face 30b opposed to the upper face 30a in the Z-axis direction. In this example, the Z-axis direction is perpendicular to the upper face 30a of the first semiconductor layer 30 and the lower face 30b of the first semiconductor layer 30. The upper face 30a and the lower face 30b need not be strictly perpendicular to the Z-axis direction.

The semiconductor light emitting device 110 has a rectangular shape when viewed from the Z-axis direction. In this example, a second direction perpendicular to the first direction is parallel to the X-axis direction. A third direction perpendicular to the first direction and the second direction is parallel to the Y-axis direction. A width of the semiconductor light emitting device 110 in the X-axis direction (length along the X-axis direction) is 0.2 mm or more and 3 mm or less. In this example, it is 0.6 mm. A width of the semiconductor light emitting device 110 in the Y-axis direction (length along the Y-axis direction) is 0.2 mm or more and 3 mm or less. In this example, it is 0.6 mm. However, it is to be noted that the second direction is not limited to the X-axis direction, and may be any direction perpendicular to the Z-axis direction.

A thickness of the first semiconductor layer 30 (length along the Z-axis direction) is 0.1 μm or more and 10 μm or less. In this example, the thickness of the first semiconductor layer 30 is 5 μm. A thickness of the light-emitting layer 32 is 5 nm or more and 100 nm or less. In this example, the thickness of the light-emitting layer 32 is 10 nm. A thickness of the second semiconductor layer 34 is 5 nm or more and 300 nm or less. In this example, the thickness of the second semiconductor layer 34 is 100 nm.

The first semiconductor layer 30 has a rectangular shape when viewed from the Z-axis direction. A width of the first semiconductor layer 30 in the X-axis direction is 550 μm or more and 700 μm or less. In this example, the width of the first semiconductor layer 30 in the X-axis direction is 600 μm. A width of the first semiconductor layer 30 in the Y-axis direction is 550 μm or more and 700 μm or less. In this example, the width of the first semiconductor layer 30 in the Y-axis direction is 600 μm.

Figure 2:
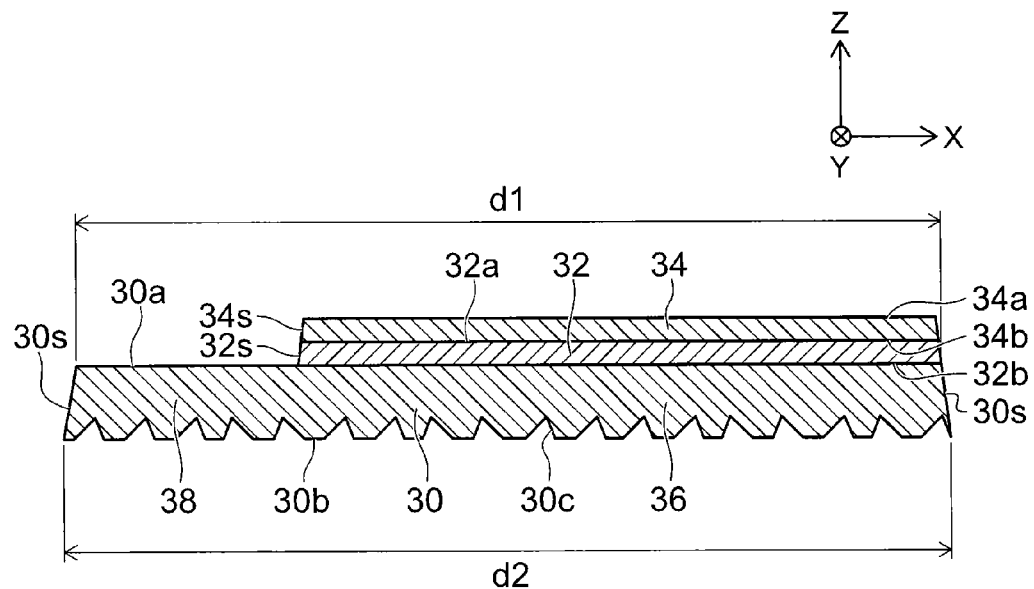
FIG. 2 is a schematic cross-sectional view illustrating one part of the semiconductor light emitting device according to the first embodiment.

FIG. 2 is a schematic cross-sectional view illustrating one part of the semiconductor light emitting device according to the first embodiment.

FIG. 2 illustrates the light emitting unit 10.

The first semiconductor layer 30 has a side face 30s intersecting with the upper face 30a and the lower face 30b.

As shown in FIG. 2, a length d1 of the upper face 30a of the first semiconductor layer 30 along the X-axis direction is shorter than a length d2 of the lower face 30b of the first semiconductor layer 30 along the X-axis direction. In addition, a length of the upper face 30a of the first semiconductor layer 30 along the Y-axis direction is shorter than a length of the lower face 30b of the first semiconductor layer 30 along the Y-axis direction. In other words, an area of the upper face 30a is smaller than an area of the lower face 30b. When the first semiconductor layer 30 is projected onto the X-Y plane, a whole part of the upper face 30a overlaps with the lower face 30b. Thus, the side face 30s of the first semiconductor layer 30 is inclined with respect to the Z-axis direction. The side face 30s of the first semiconductor layer 30 has a shape of a side face of a quadrangular pyramid. That is, the first semiconductor layer 30 has a mesa shape.

Side faces of the light-emitting layer 32 and the second semiconductor layer 34 are also inclined with respect to the Z-axis direction. A length of an upper face of the light emitting unit 10 (such as an upper face 34a of the second semiconductor layer 34) along the X-axis direction is shorter than a length of a lower face of the light emitting unit 10 (lower face 30b of the first semiconductor layer 30) along the X-axis direction. A length of the upper face of the light emitting unit 10 along the Y-axis direction is shorter than a length of the lower face of the light emitting unit 10 along the Y-axis direction.

The first electrode 12 is provided on the second portion 38, and electrically connected to the first semiconductor layer 30. That is, the first electrode 12 is provided on an exposed part of the first semiconductor layer 30. The second electrode 14 is provided on the second semiconductor layer 34, and electrically connected to the second semiconductor layer 34. Each of the first electrode 12 and the second electrode 14 is made of a material having conductivity such as a metal material. Each of the first electrode 12 and the second electrode 14 may have a single-layer structure using one material, or a stacked structure using a plurality of materials.

The rectifying element 16 includes a third electrode 40, a fourth electrode 42, and a rectifying unit 44.

The rectifying unit 44 passes a current in one direction (such as forward direction) between the third electrode 40 and the fourth electrode 42. The rectifying unit 44 is likely to pass the current in the one direction between the third electrode 40 and the fourth electrode 42, and unlikely to pass the current in the other direction (such as reverse direction) between the third electrode 40 and the fourth electrode 42. For example, the current does not flow in the reverse direction in the rectifying unit 44. Alternatively, the current flowing in the reverse direction is smaller than the current flowing in the forward direction in the rectifying unit 44. In this example, the current flows from the third electrode 40 to the fourth electrode 42.

The rectifying unit 44 is provided below the lower face 30b of the first semiconductor layer 30, and so as not to overlap with the light emitting unit 10 in the Z-axis direction. When the rectifying unit 44 is projected onto the plane (X-Y plane) intersecting with the Z-axis direction, it does not overlap with the light emitting unit 10. The rectifying unit 44 has an upper face 44a which is not parallel to the Z-axis direction. The upper face 44a of the rectifying unit 44 is provided at substantially the same level as that of the lower face 30b of the first semiconductor layer 30 in the Z-axis direction.

The rectifying unit 44 includes a first semiconductor part 46, and a second semiconductor part 48.

The first semiconductor part 46 includes a p-type semiconductor film 50 (first film), an n-type semiconductor film 51 (second film) provided on the p-type semiconductor film 50, and an $n^+$ semiconductor film 52 (third film) provided on the n-type semiconductor film 51. An n-type impurity concentration of the $n^+$ semiconductor film 52 is higher than an n-type impurity concentration of the n-type semiconductor film 51. The second semiconductor part 48 includes a p-type semiconductor film 54 (fourth film), an n-type semiconductor film 55 (fifth film) provided on the p-type semiconductor film 54, and a $p^+$ semiconductor film 56 (sixth film) provided on the n-type semiconductor film 55. A p-type impurity concentration of the $p^+$ semiconductor film 56 is higher than a p-type impurity concentration of the p-type semiconductor film 54.

A p-n junction is formed between the $p^+$ semiconductor film 56 of the second semiconductor part 48 and the $n^+$ semiconductor film 52 of the first semiconductor part 46. That is, the rectifying unit 44 serves as a diode D1 (refer to FIG. 3) which has a rectifying function with the p-n junction between the $n^+$ semiconductor film 52 and the $p^+$ semiconductor film 56.

The third electrode 40 is provided on the second semiconductor part 48. The third electrode 40 is electrically connected to the $p^+$ semiconductor film 56. The fourth electrode 42 is provided on the first semiconductor part 46. The fourth electrode 42 is electrically connected to the $n^+$ semiconductor film 52. Each of the third electrode 40 and the fourth electrode 42 is made of a material having conductivity.

When the light emitting unit 10 is projected onto the X-Y plane, it is disposed between the first semiconductor part 46 and the second semiconductor part 48.

A shape of the rectifying unit 44 when viewed from the Z-axis direction is ring shape surrounding the light emitting unit 10.

The first semiconductor part 46 has a first body part 46a (first extension part) extending along the Y-axis direction (extension direction), a first projection part 46b (second extension part) extending from one end of the first body part 46a to the second semiconductor part 48 in the X-axis direction, and a second projection part 46c (third extension part) extending from the other end of the first body part 46a to the second semiconductor part 48 in the X-axis direction.

The second semiconductor part 48 has a second body part 48a (fourth extension part) extending along the Y-axis direction, a third projection part 48b (fifth extension part) extending from one end of the second body part 48a to the first projection part 46b in the X-axis direction and reaching an end of the first projection part 46b, and a fourth projection part 48c (sixth extension part) extending from the other end of the second body part 48a toward the second projection part 46c in the X-axis direction and reaching an end of the second projection part 46c.

The first semiconductor part 46 and the second semiconductor part 48 form the p-n junction between the n$^+$ semiconductor film 52 and the p$^+$ semiconductor film 56, in a contact part between the first projection part 46b and the third projection part 48b, and in a contact part between the second projection part 46c and the fourth projection part 48c.

A thickness of the rectifying unit 44 (a depth from the upper face 44a in the Z-axis direction) is 10 μm or more and 100 μm or less. In this example, the thickness of the rectifying unit 44 is 30 μm. Each of a width d3 of the first body part 46a in the X-axis direction and a width d4 of the second body part 48a in the X-axis direction is 5 μm or more and 100 μm or less. In this example, each of the widths d3 and d4 is 50 μm.

An insulating film 60 (first insulating film) is provided on the light emitting unit 10. The insulating film 60 is provided so as not to cover the first electrode 12 and the second electrode 14. The insulating film 60 covers the part except for the first electrode 12 and the second electrode 14, and electrically insulates the part of the light emitting unit 10 except for the first electrode 12 and the second electrode 14. The insulating film 60 is made of an inorganic material such as $SiO_2$, SiN, phosphorus silicate glass (PSG), or boron phosphorus silicate glass (BPSG). A thickness of the insulating film 60 is approximately 400 nm. The insulating film 60 is formed by a CVD, vapor deposition, or sputtering method.

The first interconnection 18 and the second interconnection 20 are provided on the light emitting unit 10 and the insulating film 60. The first interconnection 18 electrically connects the first electrode 12 to the third electrode 40 serving as one electric end of the rectifying unit 44. Thus, the n-type first semiconductor layer 30 and the p$^+$ semiconductor film 56 of the second semiconductor part 48 are electrically connected through the first electrode 12, the first interconnection 18, and the third electrode 40. The second interconnection 20 electrically connects the second electrode 14 to the fourth electrode 42 serving as the other electrical end of the rectifying unit 44. Thus, the p-type second semiconductor layer 34 and the n$^+$ semiconductor film 52 of the first semiconductor part 46 are electrically connected through the second electrode 14, the second interconnection 20, and the fourth electrode 42.

An insulating film 62 (second insulating film) is provided on the first interconnection 18 and the second interconnection 20. The insulating film 62 fills up irregularities made by the first semiconductor layer 30 and the second semiconductor layer 34, and forms a flat face 62a on the light emitting unit 10 and the rectifying element 16. The insulating film 62 includes an inorganic film made of $SiO_2$, SiN, PSG, or BPSG, and an organic film made of polyimide, PBO, BCB, fluorine resin, epoxy resin, or phenol resin.

A first conductive film 64 and a second conductive film are provided on the insulating film 62. The second conductive film 66 is disposed so as to be separated from the first conductive film 64. The first conductive film 64 is electrically connected to the first interconnection 18 through a contact part 64a. The second conductive film 66 is electrically connected to the second interconnection 20 through a plurality of contact parts 66a.

The first metal pillar 22 has a column shape extending in the Z-axis direction. The first metal pillar 22 has an end 22a which is not parallel to the Z-axis direction. The first metal pillar 22 is provided on the first conductive film 64, and electrically connected to the first conductive film 64. Thus, an electric path is formed from the first metal pillar 22 to the first semiconductor layer 30 through the first conductive film 64, the first interconnection 18, and the first electrode 12.

The second metal pillar 24 has a column shape extending in the Z-axis direction. The second metal pillar 24 has an end 24a which is not parallel to the Z-axis direction. The second metal pillar 24 is provided on the second conductive film 66, and electrically connected to the second conductive film 66. Thus, an electric path is formed from the second metal pillar 24 to the second semiconductor layer 34 through the second conductive film 66, the second interconnection 20, and the second electrode 14.

The first metal pillar 22 and the second metal pillar 24 are used to electrically connect the semiconductor light emitting device 110 to an external device. In this example, the first metal pillar 22 serves as an n-side cathode, and the second metal pillar 24 serves as a p-side anode. When the semiconductor light emitting device 110 is used, a voltage is applied across the first metal pillar 22 and the second metal pillar 24 so that the first metal pillar 22 becomes negative and the second metal pillar 24 becomes positive. Thus, the forward voltage is applied to the light emitting unit 10, and light is emitted from the light-emitting layer 32. In addition, each of the number of the first metal pillar 22 and the number of the second metal pillar 24 is not limited to one, and it may be the plural number.

In the semiconductor light emitting device 110, the lower face 30b of the first semiconductor layer 30 serves as a light outputting surface. That is, in this example, the light emitted from the light-emitting layer 32 is output from the lower face 30b to an outside of the semiconductor light emitting device 110. The lower face 30b is provided with small irregularities 30c formed by a frost process using wet etching or dry etching. The irregularities 30c prevent the light emitted from the light-emitting layer 32 from being totally reflected at the lower face 30b. Thus, light outputting efficiency is improved.

The sealing unit 26 seals the first metal pillar 22 and the second metal pillar 24 while exposing the end 22a of the first metal pillar 22 and the end 24a of the second metal pillar 24. The end 22a of the first metal pillar 22 is provided on an opposite side of the first metal pillar 22 on which the first conductive film 64 is provided. The end 24a of the second metal pillar 24 is provided on an opposite side of the second metal pillar 24 on which the second conductive film 66 is provided. The sealing unit 26 covers the side faces of the first metal pillar 22 and covers the side faces of the second metal pillar 24. Thus, the sealing unit 26 protects the first metal pillar 22 and the second metal pillar 24. In addition, the sealing unit 26 supports the light emitting unit 10 and the rectifying element 16. The sealing unit 26 is made of an insulating resin such as an epoxy resin. The sealing unit 26 may include a quartz filler or an alumina filler. Thus, thermal conductivity of the sealing unit 26 can be improved, and a radiation property is enhanced.

A wavelength conversion layer 68 is provided under the first semiconductor layer 30. The wavelength conversion layer 68 covers the light emitting unit 10 and the rectifying unit 44, on a lower side of the first semiconductor layer 30. The wavelength conversion layer 68 absorbs at least one part of a luminous light (first light) of the light emitting unit 10, and emits a light (second light) having a wavelength different from a wavelength of the luminous light. That is, the wavelength conversion layer 68 converts the wavelength of the light emitted from the light emitting unit 10. As the wavelength conversion layer 68, a phosphor layer is used. Here, the phosphor layer may be a film composed of a single phosphor or may be a resin film in which the phosphor is dispersed. The wavelength conversion layer 68 may be a stacked body of the plurality of phosphor layers which emit lights having different wavelengths. The luminous light of the light emitting unit 10 is an ultraviolet light, violet light, or blue light, and the light emitted from the wavelength conversion layer 68 is a yellow light or red light. A synthesized light of the light emitted from the wavelength conversion layer 68 and the luminous light is substantially a white light.

Figure 3:
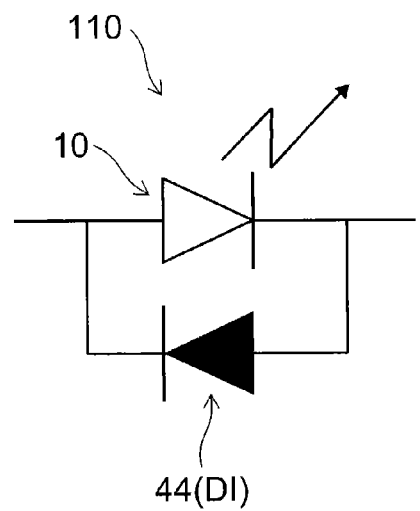
FIG. 3 is an equivalent circuit diagram illustrating the semiconductor light emitting device according to the first embodiment.

FIG. 3 is an equivalent circuit diagram illustrating the semiconductor light emitting device according to the first embodiment.

As shown in FIG. 3, the light emitting unit 10 serves as the light-emitting diode. The rectifying unit 44 serves as the diode D1. In the semiconductor light emitting device 110, the n-type first semiconductor layer 30 and the p$^+$ semiconductor film 56 of the second semiconductor part 48 are electrically connected through the first interconnection 18. In addition, in the semiconductor light emitting device 110, the p-type second semiconductor layer 34 and the n$^+$ semiconductor film 52 of the first semiconductor part 46 are electrically connected through the second interconnection 20. Thus, the rectifying unit 44 is connected to the light emitting unit 10 in parallel in an opposite direction.

A forward drop voltage of the rectifying unit 44 is lower than an allowable peak reverse voltage in the light emitting unit 10 (hereinafter, referred to as the reverse breakdown voltage). In addition, the reverse breakdown voltage of the rectifying unit 44 is higher than a forward voltage applied to the light emitting unit 10 at the time of operation.

The rectifying unit 44 passes the current when the reverse overvoltage (voltage more than the reverse breakdown voltage of the light emitting unit 10) is applied to the semiconductor light emitting device 110 due to the ESD. When the rectifying unit 44 passes the current, a maximum value of the reverse voltage applied to the light emitting unit 10 is reduced to be not more than the forward voltage of the rectifying unit 44. Thus, the light emitting unit 10 can be protected from the reverse overvoltage in the semiconductor light emitting device 110.

When the rectifying element 16 (rectifying unit 44) is provided separately from the light emitting unit 10, the semiconductor light emitting device is increased in size. Meanwhile, when the rectifying element 16 (rectifying unit 44) is provided without changing the size of the semiconductor light emitting device, the area of the light-emitting region of the light emitting unit 10 is reduced. As a result, brightness of semiconductor light emitting device is reduced. On the other hand, according to the semiconductor light emitting device 110 according to the embodiment, while the light emitting unit 10 is protected from the reverse overvoltage, the highly-bright and small semiconductor light emitting device can be provided.

According to the semiconductor light emitting device 110, orientation of the luminous light can be adjusted by the rectifying unit 44. Thus, the shape, size, and thickness of the rectifying unit 44 may be designed in this view. That is, an adjustment may be made to the lengths of the first body part 46a and the second body part 48a in the Y-axis direction, the lengths of the projection part 46b and the second projection part 46c in the X-axis direction, and the lengths of the third projection part 48b and the fourth projection part 48c in the X-axis direction, in the rectifying unit 44.

Hereinafter, an example of a method for manufacturing the semiconductor light emitting device 110 will be described.

FIG. 4A to FIG. 4C, FIG. 5A to FIG. 5C, FIG. 6A to FIG. 6C, FIG. 7A to FIG. 7C, and FIG. 8A to FIG. 8C are schematic cross-sectional views illustrating the method for manufacturing the semiconductor light emitting device according to the first embodiment.

Figure 4A:
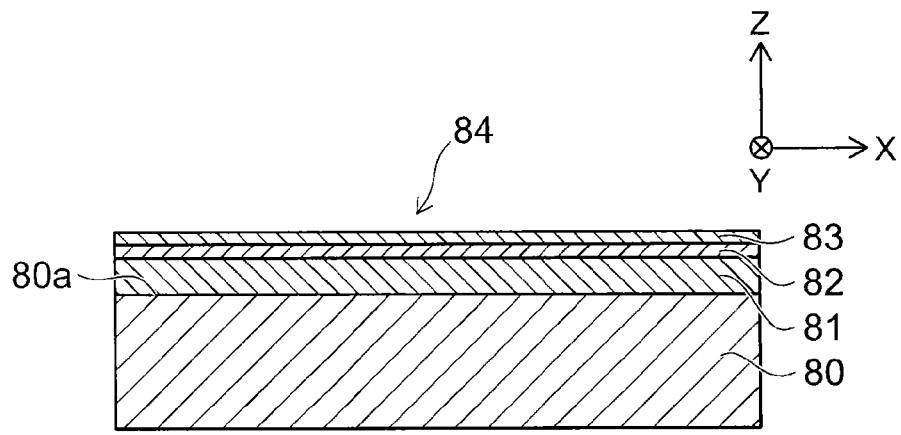
FIG. 4A to FIG. 4C are schematic cross-sectional views illustrating the method for manufacturing the semiconductor light emitting device according to the first embodiment.

As shown in FIG. 4A, a first semiconductor film 81 serving as the first semiconductor layer 30, a light-emitting film serving as the light-emitting layer 32, and a second semiconductor film 83 serving as the second semiconductor layer 34 are stacked in this order on an upper face 80a of a p-type semiconductor substrate 80 to form a stacked mother body 84. The stacked mother body 84 includes the first semiconductor film 81, the light-emitting film 82, and the second semiconductor film 83. The stacked mother body 84 may further include a buffer layer provided between the semiconductor substrate 80 and the first semiconductor film 81. The buffer layer has a function to match a lattice with the semiconductor substrate 80 and to relax stress. As the semiconductor substrate 80, a silicon substrate is used. The semiconductor substrate 80 may be an n type or non-doped. In the case where it is non-doped, as the semiconductor substrate 80, an intrinsic semiconductor with (111) surface is used. The non-doped semiconductor substrate 80 may be doped to be the p type or n type. The first semiconductor film 81, the light-emitting film 82, and the second semiconductor film 83 are formed by a metalorganic chemical vapor deposition (MOCVD) method. For example, a crystal layer including a nitride semiconductor is epitaxially grown on the silicon substrate.

Figure 4B:
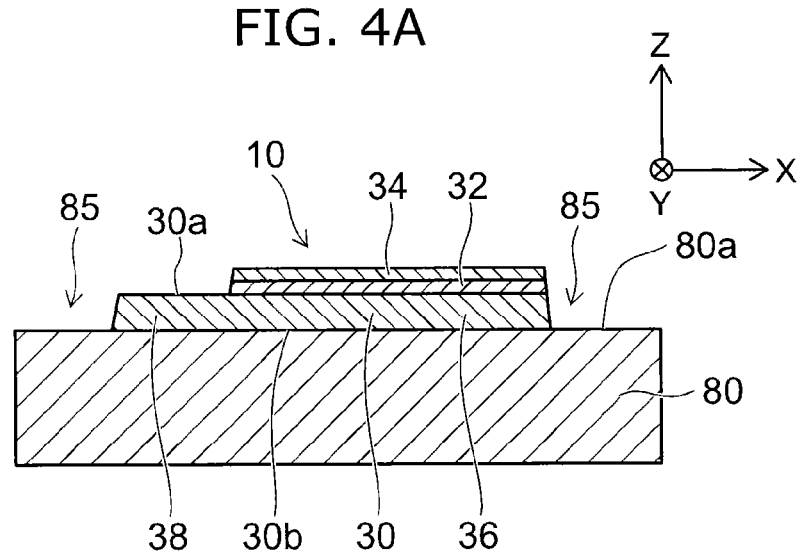

As shown in FIG. 4B, the stacked mother body 84 is partially removed by the lithography and etching process. The first semiconductor film 81 is partially removed, and the first semiconductor layer 30 is formed of the first semiconductor film 81. The light-emitting film 82 is partially removed, and the light-emitting layer 32 is formed of the light-emitting film 82. The second semiconductor film 83 is partially removed, and the second semiconductor layer 34 is formed of the second semiconductor film 83. Thus, the light emitting unit 10 is formed on the semiconductor substrate 80. The side face of the light emitting unit 10 can be formed into a mesa shape according to a condition of the etching process.

An exposed part 85 is formed around the light emitting unit 10 while the stacked mother body 84 is processed (the light emitting unit 10 is formed). The exposed part 85 is formed by partially exposing the upper face 80a of the semiconductor substrate 80. The exposed part 85 is formed into a ring shape which surrounds the light emitting unit 10.

Figure 4C:
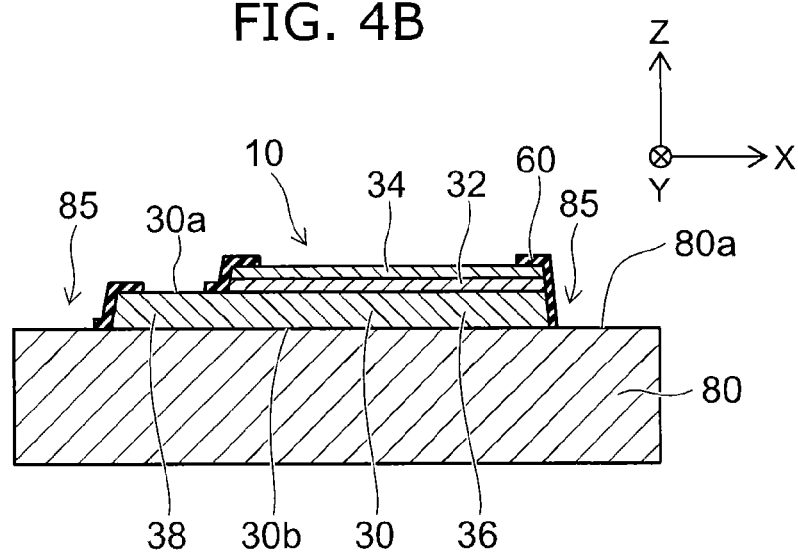

As shown in FIG. 4C, the insulating film 60 is formed on the light emitting unit 10 by a film forming process, the lithography process, and the etching process.

Figure 5A:
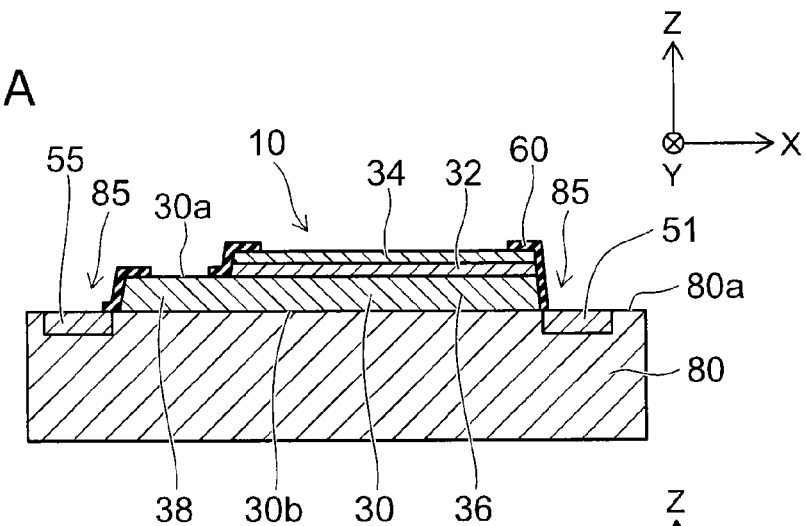
FIG. 5A to FIG. 5C are schematic cross-sectional views illustrating the method for manufacturing the semiconductor light emitting device according to the first embodiment.

As shown in FIG. 5A, the n-type semiconductor film 51 of the first semiconductor part 46 of the rectifying unit 44, and the n-type semiconductor film 55 of the second semiconductor part 48 of the rectifying unit 44 are formed in the semiconductor substrate 80 by injecting an impurity into the exposed part 85.

Figure 5B:
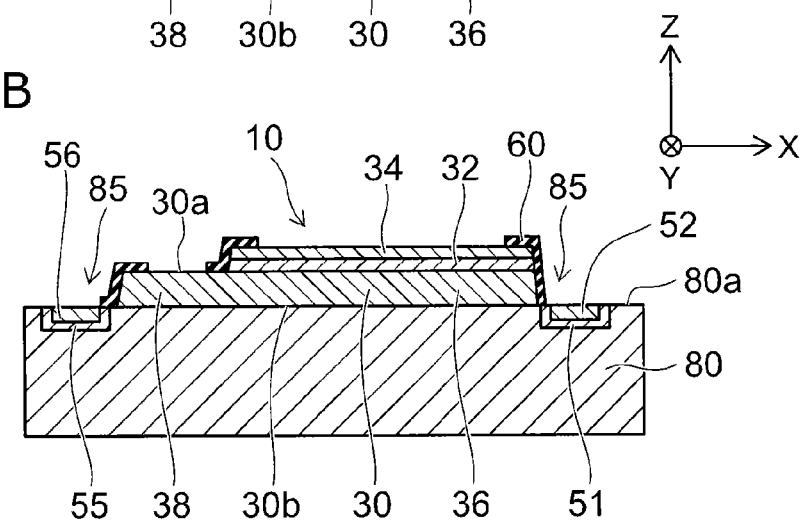

As shown in FIG. 5B, the n$^+$ semiconductor film 52 is formed on the n-type semiconductor film 51, and the p$^+$ semiconductor film 56 is formed on the n-type semiconductor film 55 by injecting impurities to the exposed part 85 again. Thus, the p-n junction is formed between the n$^+$ semiconductor film 52 and the p$^+$ semiconductor film 56, whereby the diode D1 serving as the rectifying unit 44 is formed on the semiconductor substrate 80.

Figure 5C:
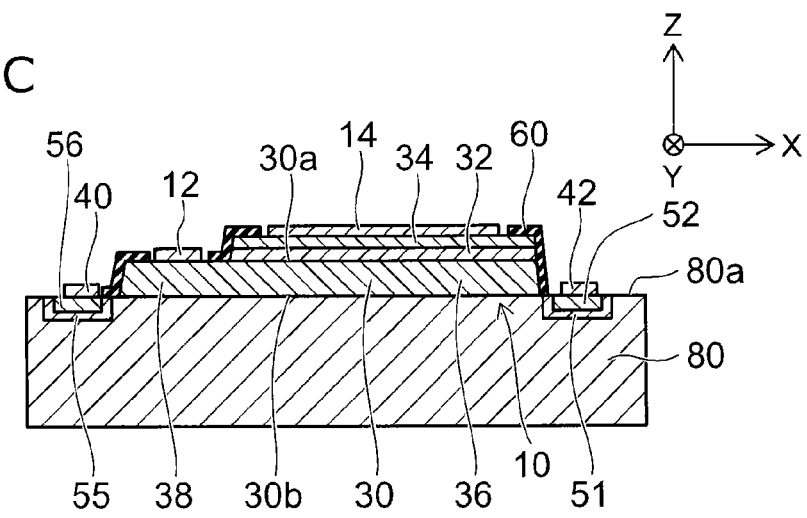

As shown in FIG. 5C, the first electrode 12 is formed on the second portion 38 of the first semiconductor layer 30. The second electrode 14 is formed on the second semiconductor layer 34. The third electrode 40 is formed on the p$^+$ semiconductor film 56. The fourth electrode 42 is formed on the n$^+$ semiconductor film 52. These electrodes can be formed at the same time.

Figure 6A:
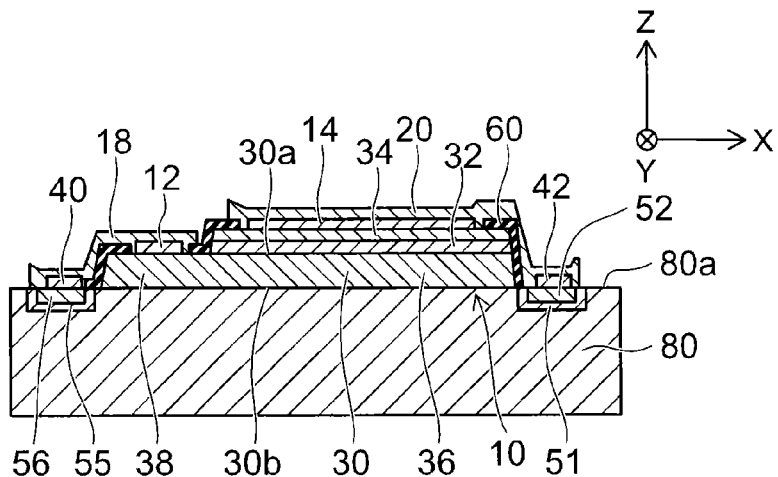
FIG. 6A to FIG. 6C are schematic cross-sectional views illustrating the method for manufacturing the semiconductor light emitting device according to the first embodiment.

As shown in FIG. 6A, the first interconnection 18 is formed on the light emitting unit 10 and the insulating film 60 to electrically connect the first electrode 12 to the third electrode 40. In addition, the second interconnection 20 is formed on the light emitting unit 10 and the insulating film 60 to electrically connect the second electrode 14 to the fourth electrode 42. The first interconnection 18 and the second interconnection 20 can be formed at the same time.

Each of the side face 30s of the first semiconductor layer 30, a side face 32s of the light-emitting layer 32, and a side face 34s of the second semiconductor layer 34 is inclined with respect to the Z-axis direction. As a result, the first interconnection 18, the second interconnection 20, and the insulating film 60 are prevented from being cut at a part bending from the Z-axis direction to the direction of the X-Y plane.

Figure 6B:
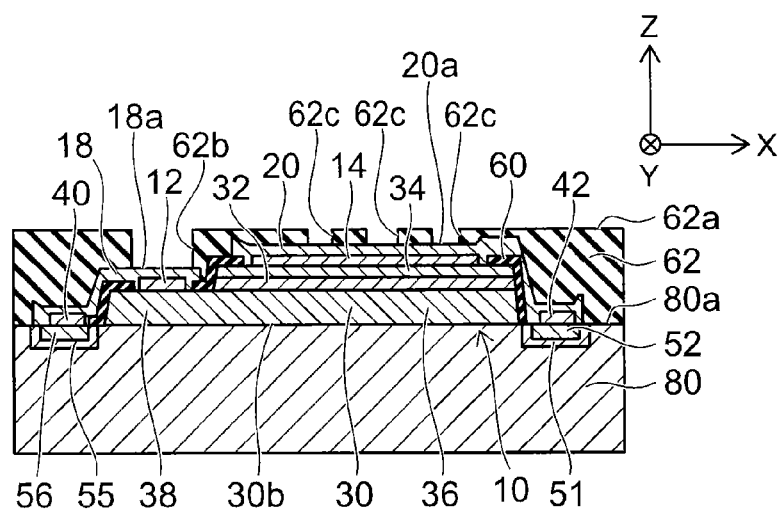

As shown in FIG. 6B, the insulating film 62 is formed on a whole part of the semiconductor substrate 80. Thus, the irregularities formed because of the light emitting unit 10 are filled and the flat face 62a is formed on the light emitting unit 10. A through hole 62b to expose one part 18a of the first interconnection 18, and a plurality of through holes 62c to expose one part 20a of the second interconnection 20 are formed in the insulating film 62.

Figure 6C:
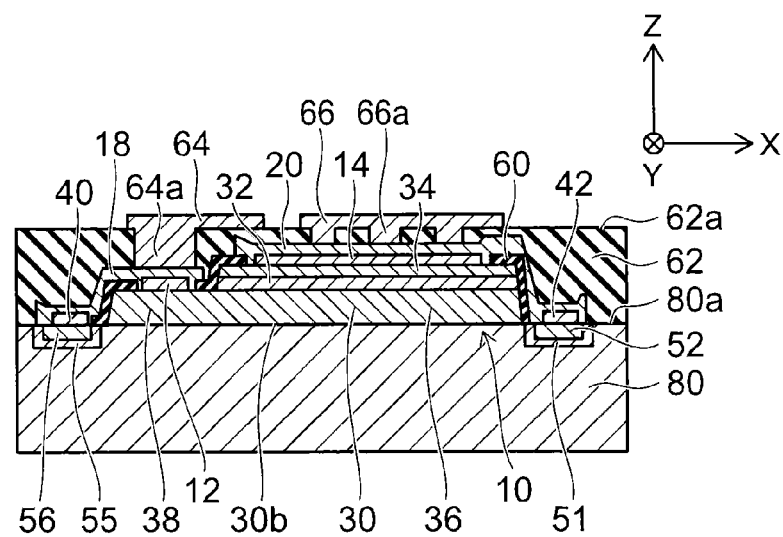

As shown in FIG. 6C, the first conductive film 64 and the second conductive film 66 are formed on the insulating film 62. The first conductive film 64 is formed to fill the through hole 62b of the insulating film 62 with a conductive material, whereby the contact part 64a is formed. The contact part 64a is in contact with one part 18a of the first interconnection 18. Thus, the first interconnection 18 is electrically connected to the first conductive film 64 through the contact part 64a. The second conductive film 66 is formed to fill the through holes 62c of the insulating film 62 with a conductive material, whereby the plurality of contact parts 66a are formed. The contact parts 66a are in contact with the one part 20a of the second interconnection 20. Thus, the second interconnection 20 is electrically connected to the second conductive film 66 through the plurality of contact parts 66a.

As shown in FIG. 7A, the first metal pillar 22 is formed on the first conductive film 64. The second metal pillar 24 is formed on the second conductive film 66.

As shown in FIG. 7B, a resin film 86 is formed so as to cover the insulating film 62, the first metal pillar 22, and the second metal pillar 24.

As shown in FIG. 7C, the semiconductor substrate 80 is partially removed, and the rectifying unit 44 is formed. As for the removal of the semiconductor substrate 80, the semiconductor substrate 80 is removed from a lower face 80b of the semiconductor substrate 80 by a grinding process, wet etching, or dry etching, so that the semiconductor substrate 80 is thinned. Then, the semiconductor substrate 80 is patterned by the lithography process and the etching process. A remaining part of the semiconductor substrate 80 serves as the p-type semiconductor film 50 of the first semiconductor part 46, and the p-type semiconductor film 54 of the second semiconductor part 48. Thus, the rectifying unit 44 is formed below the lower face 30b of the first semiconductor layer 30, and in a position where it does not overlap with the light emitting unit 10 in the Z-axis direction. At this time, the orientation of the semiconductor light emitting device 110 can be controlled by adjusting the grinding process and the patterning of the semiconductor substrate 80.

Since the rectifying unit 44 is formed below the lower face 30b of the first semiconductor layer 30, and in the position where it does not overlap with the light emitting unit 10 in the Z-axis direction, the rectifying unit 44 can be efficiently disposed, in the semiconductor light emitting device 110. Thus, even when the rectifying unit 44 is provided, the package size of the semiconductor light emitting device 110 can be prevented from being increased. Furthermore, in the case where the package size of the semiconductor light emitting device 110 is not changed, the light amount can be prevented from being reduced.

In this example, the stacked mother body 84 including the first semiconductor layer 30 is formed on the upper face 80a of the semiconductor substrate 80, and the rectifying unit 44 is formed by injecting the impurity into the upper face 80a of the semiconductor substrate 80. Thus, the upper face 44a of the rectifying unit 44 is substantially at the same level as the lower face 30b of the first semiconductor layer 30 in the Z-axis direction. Therefore, it is possible to prevent the thickness of the semiconductor light emitting device 110 from being increased because the rectifying unit 44 is provided.

In addition, in this example, the rectifying unit 44 is formed in the semiconductor substrate 80 which is used for the crystal growth of the stacked mother body 84 including the nitride semiconductor. Thus, it is possible to prevent costs of the semiconductor light emitting device 110 from being increased due to the addition of the rectifying unit 44. In this example, the silicon substrate is used as the semiconductor substrate 80, but the semiconductor substrate 80 is not limited to the silicon substrate. The semiconductor substrate 80 may be any semiconductor substrate which can grow the crystal of the nitride semiconductor.

As shown in FIG. 8A, the small irregularities 30c are formed on the lower face 30b by performing the frost process for the lower face 30b of the first semiconductor layer 30 exposed when the rectifying unit 44 is formed.

As shown in FIG. 8B, the wavelength conversion layer 68 is formed under the first semiconductor layer 30.

As shown in FIG. 8C, the resin film 86 is ground from its upper side by a grinding process. Thus, the end 22a of the first metal pillar 22 and the end 24a of the second metal pillar 24 are exposed, and the sealing unit 26 is formed of the resin film 86.

Thus, the semiconductor light emitting device 110 is completed.

According to the embodiment, the first electrode 12 and the third electrode 40 may be electrically connected through the conductive film (such as the first conductive film 64) serving as the contact part 64a. The second electrode 14 and the fourth electrode 42 may be electrically connected through the conductive film (such as the second conductive film 66) serving as the contact part 66a. That is, these may be connected without using the first interconnection 18 and the second interconnection 20. In this case, the manufacturing process can be simplified.

Figure 9:
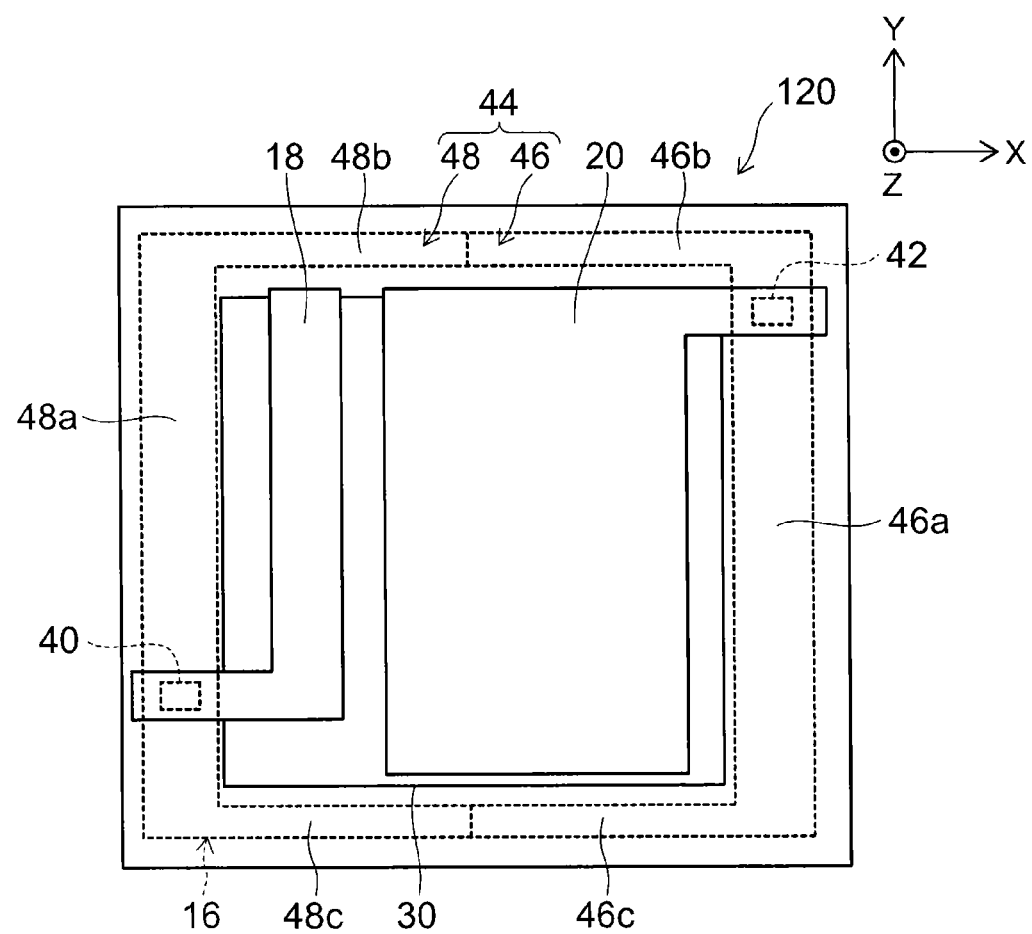
FIG. 9 is a schematic top view illustrating another semiconductor light emitting device according to the first embodiment.

FIG. 9 is a schematic top view illustrating another semiconductor light emitting device according to the first embodiment.

FIG. 9 is the schematic top view corresponding to FIG. 1B.

As shown in FIG. 9, according to another semiconductor light emitting device 120 in the embodiment, the third electrode 40 is disposed in a position shifted from the fourth electrode 42 in the Y-axis direction. Except for this, it is the same as the semiconductor light emitting device 110, so that its description is omitted.

According to the semiconductor light emitting device 110 described in the above, the third electrode 40 is aligned with the fourth electrode 42 in the X-axis direction. Thus, the third electrode 40 and the fourth electrode 42 may be arbitrarily disposed in the embodiment.

Figure 10:
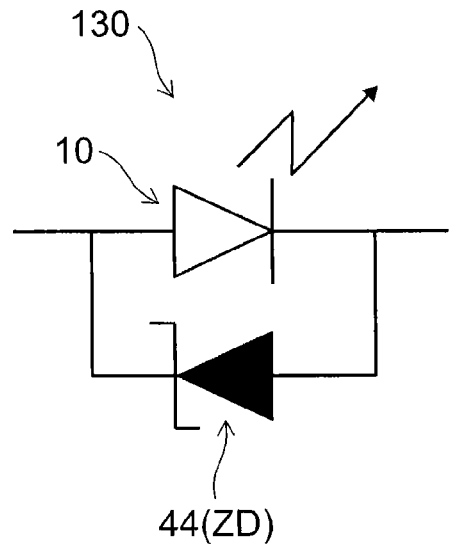
FIG. 10 is an equivalent circuit diagram illustrating the other semiconductor light emitting device according to the first embodiment.

FIG. 10 is an equivalent circuit diagram illustrating the other semiconductor light emitting device according to the first embodiment.

As shown in FIG. 10, in another semiconductor device 130 according to the embodiment, a zener diode ZD is used as the rectifying unit 44. As for the zener diode ZD, when a voltage more than the breakdown voltage is applied in the reverse direction, a certain current flows in the reverse direction.

The breakdown voltage of the zener diode ZD is set to be higher than the forward voltage applied to the light emitting unit 10 at the time of operation. The breakdown voltage of the zener diode ZD is set to be lower than the allowable peak forward voltage in the light emitting unit 10. Thus, when the forward overvoltage is applied to the light emitting unit 10, the zener diode ZD passes the current. When the zener diode ZD is used as the rectifying unit 44, the light emitting unit 10 can be protected from the forward overvoltage.

The zener diode ZD can be formed by adjusting the impurity concentrations of the $n^+$ semiconductor film 52 and the $p^+$ semiconductor film 56.

Figure 11:
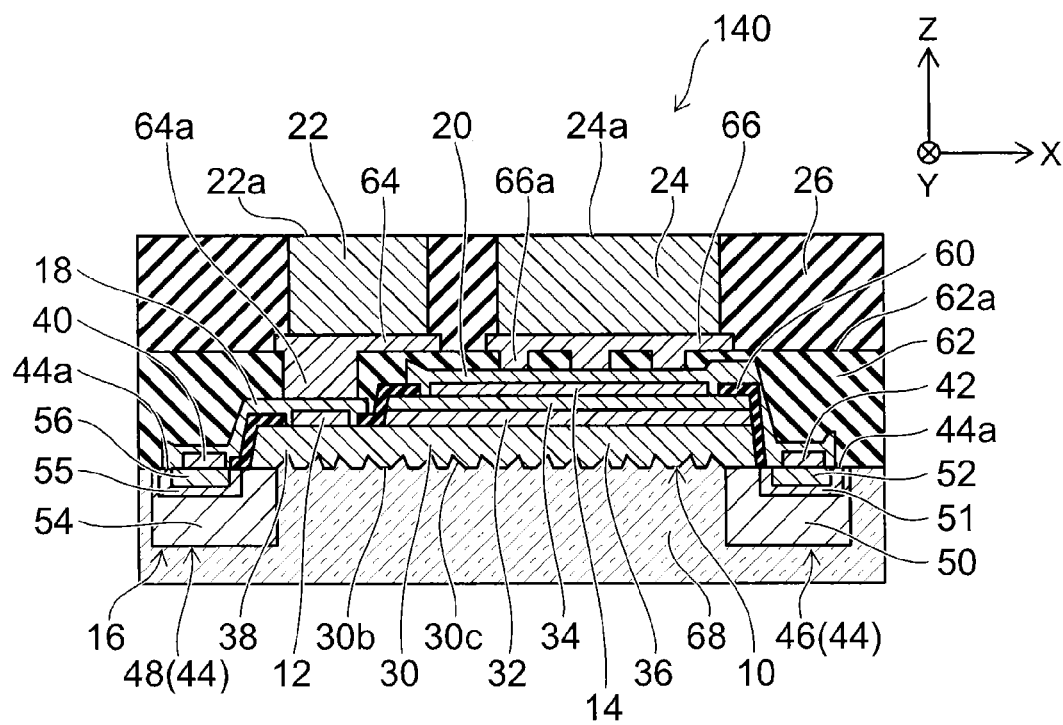
FIG. 11 is a schematic cross-sectional view illustrating another semiconductor light emitting device according to the first embodiment.

FIG. 11 is a schematic cross-sectional view illustrating another semiconductor light emitting device according to the first embodiment.

FIG. 11 is the schematic cross-sectional view corresponding to FIG. 1A.

As shown in FIG. 11, according to another semiconductor light emitting device 140 in the embodiment, the rectifying unit 44 partially overlaps with the light emitting unit 10 when viewed from the Z-axis direction. According to the semiconductor light emitting device 110 described in the above, the rectifying unit 44 does not overlap with the light emitting unit 10 in Z-axis direction. In the embodiment, at least one part of the rectifying unit 44 does not overlap with the light emitting unit 10 when viewed from the Z-axis direction.

(Second Embodiment)

Figure 12A:
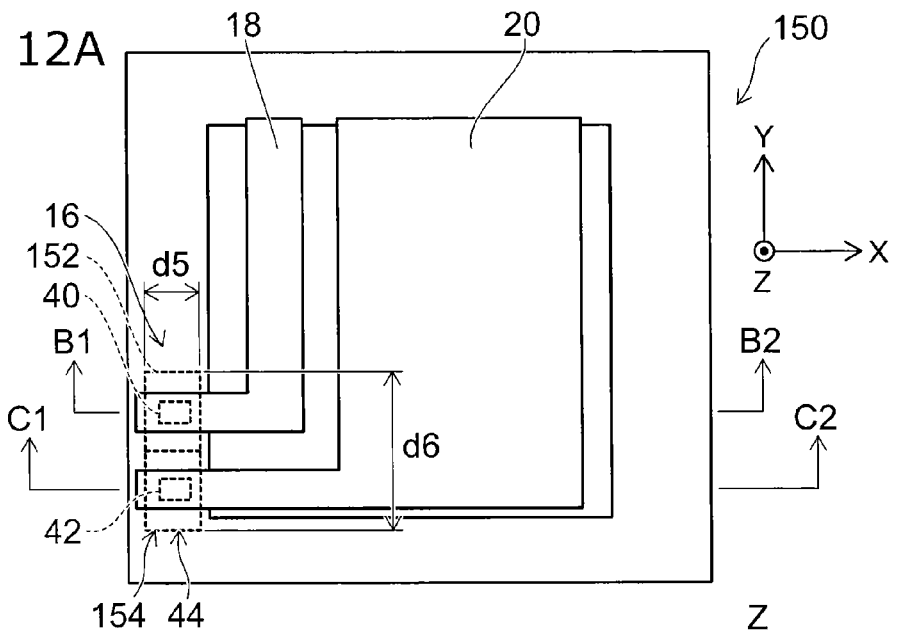
FIG. 12A to FIG. 12C are schematic views illustrating a semiconductor light emitting device according to a second embodiment.
Figure 12B:
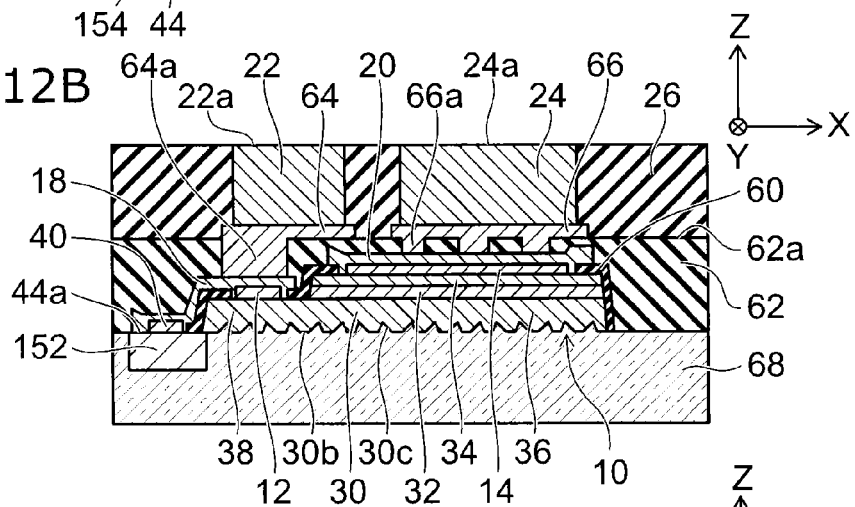
Figure 12C:
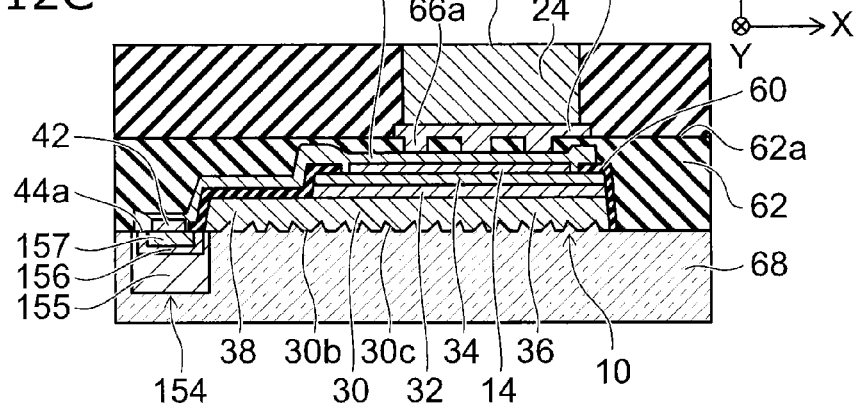

FIG. 12A to FIG. 12C are schematic views illustrating a semiconductor light emitting device according to a second embodiment.

FIG. 12A is a schematic top view, and FIG. 12B and FIG. 12C are schematic cross-sectional views. In addition, FIG. 12B schematically shows the cross section taken along a line B1-B2 in FIG. 12A. FIG. 12C schematically shows a cross section taken along a line C1-C2 in FIG. 12A.

As shown in FIG. 12A, a rectifying unit 44 of a semiconductor light emitting device 150 has a rectangular shape when viewed from the Z-axis direction. A thickness (length along the Z-axis direction) of the rectifying unit 44 from an upper face 44a in the Z-axis direction is 10 μm or more and 100 μm or less. In this example, the thickness of the rectifying unit 44 is 30 μm. A width d5 of the rectifying unit 44 in the X-axis direction is 10 μm or more and 100 μm or less. In this example, the thickness d5 is 50 μm. A width d6 of the rectifying unit 44 in the Y-axis direction is 20 μm or more and 200 μm or less. In this example, the thickness d6 is 100 μm.

The rectifying unit 44 includes a metal part 152 and a semiconductor part 154.

As shown in FIG. 12B, a third electrode 40 is provided on the metal part 152. The metal part 152 is electrically connected to a first semiconductor layer 30 through a third electrode 40, a first interconnection 18, and a first electrode 12.

As shown in FIG. 12C, the semiconductor part 154 includes a p-type semiconductor film 155, an n-type semiconductor film 156 provided on the p-type semiconductor film 155, and an $n^+$ semiconductor film 157 provided on the n-type semiconductor film 156. A fourth electrode 42 is provided on the $n^+$ semiconductor film 157. The $n^+$ semiconductor film 157 is electrically connected to a second semiconductor layer 34 through the fourth electrode 42, a second interconnection 20, and a second electrode 14. In addition, the Schottky junction is formed between the $n^+$ semiconductor film 157 and the metal part 152.

Figure 13:
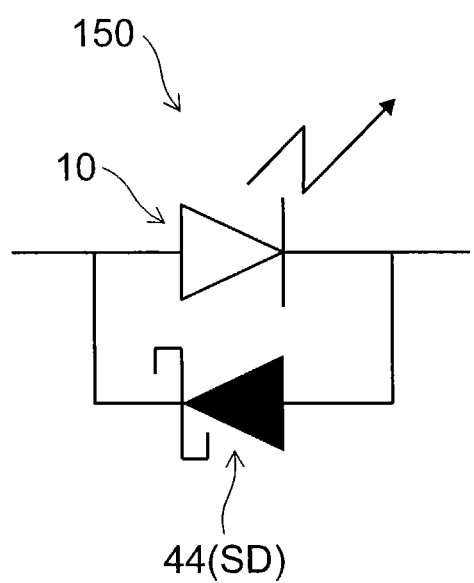
FIG. 13 is an equivalent circuit diagram illustrating the semiconductor light emitting device according to the second embodiment.

FIG. 13 is an equivalent circuit diagram illustrating the semiconductor light emitting device according to the second embodiment.

As shown in FIG. 13, the rectifying unit 44 serves as a Schottky barrier diode SD in which the Schottky junction is formed between the metal part 152 and the semiconductor part 154. According to the semiconductor light emitting device 150, the n-type first semiconductor layer 30 and the metal part 152 are electrically connected through the first interconnection 18. In addition, according to the semiconductor light emitting device 150, the p-type second semiconductor layer 34 and the $n^+$ semiconductor film 157 of the semiconductor part 154 are electrically connected through the second interconnection 20. Thus, the rectifying unit 44 is connected to the light emitting unit 10 in parallel in the reverse direction.

According to the semiconductor light emitting device 150 using the Schottky barrier diode SD as the rectifying unit 44 also, there can be provided the highly-bright and small semiconductor light emitting device in which the light emitting unit is protected from the overvoltage.

When the semiconductor device 150 is manufactured, the insulating film 60 is formed, and then the semiconductor part 154 is formed by injecting an impurity to the exposed part of an upper face 80a of the semiconductor substrate 80 as shown in FIG. 4C. Then, the exposed part of the upper face 80a of the semiconductor substrate 80 is processed by the etching process to form a rectangular hole. Then, the hole is filled with a conductive material, whereby the metal part 152 is formed. After that, the semiconductor device 150 can be manufactured by the same procedure as that of the semiconductor device 110.

According to the semiconductor device 150, the shape of the Schottky barrier diode SD is the rectangular shape when viewed from the Z-axis direction. In the embodiment, the shape of the Schottky barrier diode SD when viewed from the Z-axis direction may be a ring shape which surrounds the light emitting unit 10. In addition, in the semiconductor device 110, the shape of the diode D1 when viewed from the Z-axis direction may be a rectangular shape.

Figure 14:
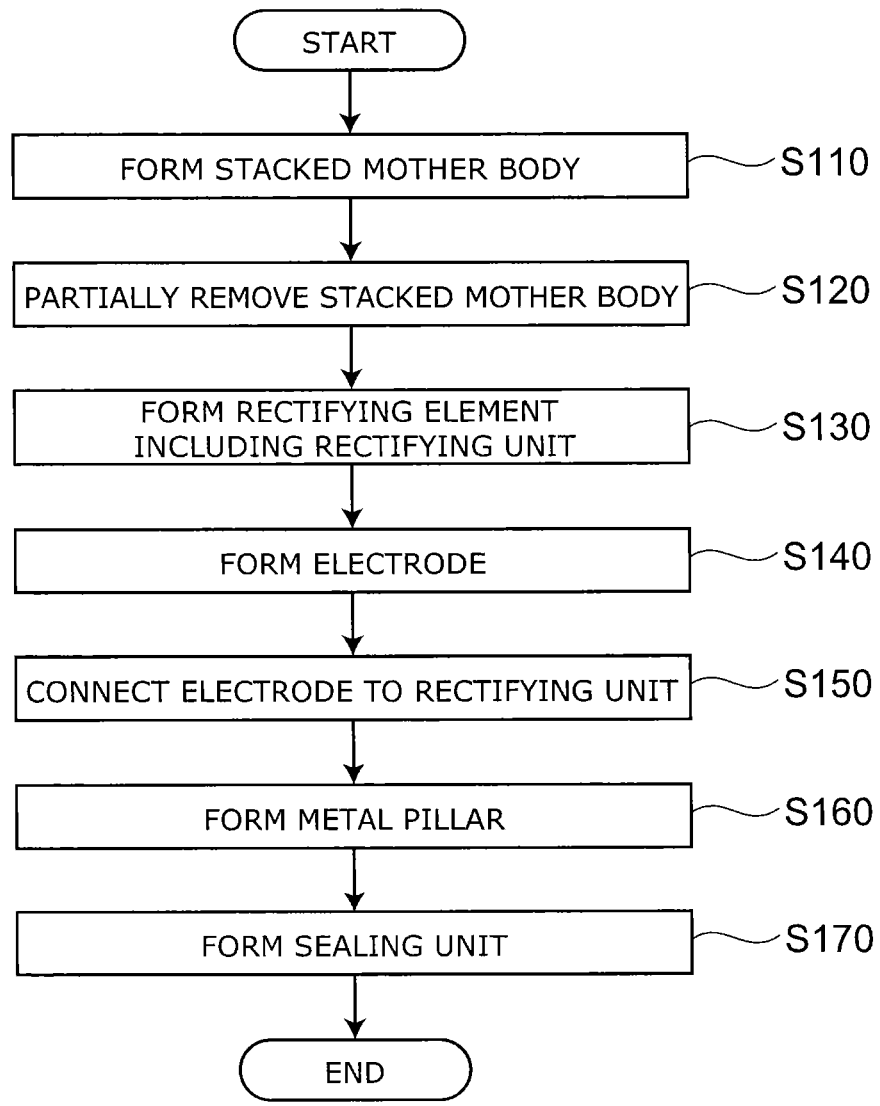
FIG. 14 is a flowchart illustrating the method for manufacturing the semiconductor light emitting device according to the embodiment.

FIG. 14 is a flowchart illustrating the method for manufacturing the semiconductor light emitting device according to the embodiment.

As shown in FIG. 14, the method for manufacturing the semiconductor light emitting device according to the embodiment includes a step S110 for forming a stacked mother body 84. The method further includes a step S120 for partially removing the stacked mother body 84 to form the light emitting unit 10, and partially expose the upper face 80a of the semiconductor substrate 80. The method further includes a step S130 for forming a rectifying element 16 including the rectifying unit 44. The method further includes a step S140 for forming the first electrode 12, and forming the second electrode 14. The method further includes a step S150 for electrically connecting the first electrode 12 to the one end of the rectifying unit 44, and electrically connecting the second electrode 14 to the other end of the rectifying unit 44. The method further includes a step S160 for forming the first metal pillar 22, and forming the second metal pillar 24. The method further includes a step S170 for forming the sealing unit 26. The order of the processes S110 to S170 may be changed within a technically possible range. In addition, the processes may be performed at the same time within the technically possible range.

In the step S110, the process described with reference to FIG. 4A is performed. In the step S120, the process described with reference to FIG. 4B is performed. In the step S130, the process described with reference to FIG. 5A and FIG. 5B is performed. In the step S140, the process described with reference to FIG. 5C is performed. In the step S150, the process described with reference to FIG. 6A is performed. In the step S160, the process described with reference to FIG. 7A is performed. In the step S170, the process described with reference to FIG. 8B is performed. Thus, the semiconductor light emitting device which is protected from the overvoltage, high in brightness, and small in size can be manufactured.

According to the embodiment, there is provided the semiconductor light emitting device which is protected from overvoltage, high in brightness, and small in size and the method for manufacturing the element.

In addition, in the specification, the nitride semiconductor includes all semiconductors having any composition expressed by a chemical formula $B_xIn_yAl_zGa_{1-x-y-z}N$ ($0 \leq x \leq 1$, $0 \leq y \leq 1$, $0 \leq z \leq 1$, $x+y+z \leq 1$), in which the composition ratios x, y, and z are changed within their respective ranges. In addition, the nitride semiconductor expressed in the above chemical formula include the one further including a group V element other than nitride (N), the one further including various elements added to control various physical properties such as conductivity type, and the one further including various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

As described above, the embodiment of the invention has been described with reference to the specific example. However, the embodiment of the invention is not limited to the specific examples. As for the specific configuration of each of the first semiconductor layers, the light-emitting layers, the second semiconductor layers, the light emitting units, the first electrodes, the second electrodes, the first metal pillars, the second metal pillars, the sealing units, the rectifying units, the rectifying elements, the first interconnections, the second interconnections, the first semiconductor parts, the second semiconductor parts, the semiconductor parts, the metal parts, the wavelength conversion layers, and the stacked mother bodies included in the semiconductor light emitting device, it is included in the scope of the invention as long as those in the art can implement the invention similarly and obtain the similar effect by appropriately selecting it within the known range.

Further, any two or more components of the specific examples may be combined within the extent of technical feasibility and are included in the scope of the invention to the extent that the purport of the invention is included.

Moreover, all semiconductor light emitting devices and methods for manufacturing the same practicable by an appropriate design modification by one skilled in the art based on the semiconductor light emitting devices and methods for manufacturing the same described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
   a light emitting unit including a first semiconductor layer, a light-emitting layer, and a second semiconductor layer, the first semiconductor layer having a first conductivity type and having a first portion and a second portion, the light-emitting layer provided on the first portion, the second semiconductor layer having a second conductivity type and provided on the light-emitting layer;
   a first electrode provided on the second portion and electrically connected to the first semiconductor layer;
   a second electrode provided on the second semiconductor layer and electrically connected to the second semiconductor layer;
   a first metal pillar electrically connected to the first electrode, extending in a first direction from the first semiconductor layer to the second semiconductor layer, and having an end not parallel to the first direction;
   a second metal pillar electrically connected to the second electrode, extending in the first direction, and having an end not parallel to the first direction;
   a sealing unit for sealing the first metal pillar and the second metal pillar, the sealing unit exposing the end of the first metal pillar and the end of the second metal pillar;
   a rectifying element provided below the first semiconductor layer, including a rectifying unit having at least one part not overlapping with the light emitting unit when projected onto a plane intersecting with the first direction;
   a first interconnection for electrically connecting the first electrode to one end of the rectifying unit;
   a second interconnection for electrically connecting the second electrode to another end of the rectifying unit; and
   a wavelength conversion layer provided under the first semiconductor layer, covering the light emitting unit and the rectifying unit, absorbing at least one part of a first light emitted from the light emitting unit, and emitting a second light having a wavelength different from a wavelength of the first light.

2. The device according to claim 1, wherein
   the rectifying unit includes
   a first semiconductor part having the first conductivity type and electrically connected to the second interconnection, and
   a second semiconductor part having the second conductivity type, jointed to the first semiconductor part and electrically connected to the first interconnection.

3. The device according to claim 2, wherein
   the first semiconductor part includes
   a first film having the second conductivity type,
   a second film having the first conductivity type and provided on the first film, and
   a third film having the first conductivity type, provided on the second film, and having an impurity concentration higher than an impurity concentration of the second film, and the second semiconductor part includes
a fourth film having the second conductivity type,
a fifth film having the first conductivity type and provided on the fourth film, and
a sixth film having the second conductivity type, provided on the fifth film, jointed to the third film, and having an impurity concentration higher than an impurity concentration of the fourth film.

4. The device according to claim 2, wherein
the light emitting unit is disposed between the first semiconductor part and the second semiconductor part when projected onto the plane,
the first semiconductor part includes
    a first extension part extending along an extension direction perpendicular to the first direction,
    a second extension part extending from one end of the first extension part to the second semiconductor part, and
    a third extension part extending from another end of the first extension part to the second semiconductor part, and
the second semiconductor part includes
    a fourth extension part extending along the extension direction,
    a fifth extension part extending from one end of the fourth extension part to the second extension part, and reaching the second extension part, and
    a sixth extension part extending from another end of the fourth extension part to the third extension part, and reaching the third extension part.

5. The device according to claim 2, wherein the rectifying unit comprises a zener diode.

6. The device according to claim 1, wherein
the rectifying unit comprises a Schottky barrier diode including
    a semiconductor part having the first conductivity type and electrically connected to the second interconnection, and
    a metal part electrically connected to the first interconnection and jointed to the semiconductor part.

7. The device according to claim 1, wherein
the first semiconductor layer has an upper face not parallel to the first direction, and a lower face opposed to the upper face in the first direction, and
a length of the upper face of the first semiconductor layer along a second direction perpendicular to the first direction is shorter than a length of the lower face of the first semiconductor layer along the second direction.

8. The device according to claim 7, wherein
the first semiconductor layer has a side face intersecting with the upper face and the lower face,
an area of the upper face of the first semiconductor layer is smaller than an area of the lower face of the first semiconductor layer,
a whole part of the upper face of the first semiconductor layer overlaps with the lower face of the first semiconductor layer when projected onto the plane, and
the side face of the first semiconductor layer is inclined with respect to the first direction.

9. The device according to claim 1, wherein
the rectifying unit has a upper face not parallel to the first direction,
the first semiconductor layer has a lower face not parallel to the first direction, and
the upper face of the rectifying unit is at a same level as the lower face of the first semiconductor layer.

10. The device according to claim 1, wherein the rectifying unit surrounds the light emitting unit when projected onto the plane.

11. The device according to claim 1, wherein a shape of the rectifying unit is a rectangular shape when projected onto the plane.

12. The device according to claim 1, wherein the light emitting unit does not overlap with a whole part of the rectifying unit when projected onto the plane.

13. The device according to claim 1, further comprising
a first insulating film provided on the light emitting unit, wherein
the first insulating film is provided so as not cover the first electrode and the second electrode, and
the first interconnection and the second interconnection are provided on the first insulating film.

14. The device according to claim 1, further comprising:
a second insulating film provided on the first interconnection and the second interconnection;
a first conductive film provided on the second insulating film; and
a second conductive film provided on the second insulating film, and disposed so as to be separated from the first conductive film, wherein
the second insulating film has a through hole to expose one part of the first interconnection, and a through hole to expose one part of the second interconnection,
the first conductive film is in contact with the one part of the first interconnection and electrically connected to the first interconnection,
the second conductive film is in contact with the one part of the second interconnection and electrically connected to the second interconnection,
the first metal pillar is provided on the first conductive film and electrically connected to the first conductive film, and
the second metal pillar is provided on the second conductive film and electrically connected to the second conductive film.

15. The device according to claim 1, wherein each of the first semiconductor layer, the light-emitting layer, and the second semiconductor layer include a nitride semiconductor.

16. The device according to claim 1, wherein the rectifying unit includes silicon.

17. The device according to claim 1, wherein the sealing unit includes a resin.

* * * * *